(12) United States Patent
Singh et al.

(10) Patent No.: US 6,319,643 B1
(45) Date of Patent: Nov. 20, 2001

(54) CONDUCTIVE PHOTORESIST PATTERN FOR LONG TERM CALIBRATION OF SCANNING ELECTRON MICROSCOPE

(75) Inventors: Bhanwar Singh, Morgan Hill; Bryan K. Choo, Mountain View; Ramkumar Subramanian, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 29 days.

(21) Appl. No.: 09/596,680

(22) Filed: Jun. 19, 2000

(51) Int. Cl.$^7$ ................................ G03F 9/00; G03C 5/00
(52) U.S. Cl. ............................ 430/30; 430/296; 430/942
(58) Field of Search ........................ 430/30, 296, 942

(56) References Cited

U.S. PATENT DOCUMENTS

| | | | |
|---|---|---|---|
| 4,312,935 | 1/1982 | Engler et al. | 430/296 |
| 5,185,100 | 2/1993 | Han et al. | 252/500 |
| 5,403,680 | 4/1995 | Otagawa et al. | 429/213 |
| 5,545,308 | 8/1996 | Murphy et al. | 205/125 |
| 5,702,566 | 12/1997 | Tsui | 156/643.1 |
| 5,858,879 | 1/1999 | Chao et al. | 438/725 |
| 5,958,301 | 9/1999 | Angelopoulos et al. | 252/500 |
| 5,976,284 | 11/1999 | Calvert et al. | 156/51 |

OTHER PUBLICATIONS

Hasegawa, et al., "Submicron Pattern Dimension Determination a Using Total Waveform Comparison Method," J. Vac. Sci Technol. B 6 (3) May/Jun. 1988.

*Primary Examiner*—Christopher G. Young
(74) *Attorney, Agent, or Firm*—Amin & Turocy, LLP (57) ABSTRACT

One aspect of the present invention relates to a method of calibrating a measurement instrument that uses an electron beam, involving the steps of providing a conductive photoresist on a semiconductor structure having a conductivity of at least about 0.1 S/cm; exposing and developing the conductive photoresist to provide a patterned conductive photoresist; using the semiconductor structure having the patterned conductive photoresist thereon as a standard for calibration; and calibrating the measurement instrument. Another aspect of the present invention relates to a method of reducing electrostatic charges on a standard developed photoresist to improve repeated calibrations of a measurement instrument that uses an electron beam, involving the steps of providing a conductive photoresist on a semiconductor structure; exposing the conductive photoresist with radiation having a wavelength of about 370 nm or less; developing the conductive photoresist to provide a patterned conductive photoresist, wherein the patterned conductive photoresist has a conductivity of at least about 0.01 S/cm; and calibrating the measurement instrument with the semiconductor structure having the patterned conductive photoresist thereon as a standard.

20 Claims, 4 Drawing Sheets

CONDUCTIVE PHOTORESIST PATTERN FOR LONG TERM CALIBRATION OF SCANNING ELECTRON MICROSCOPE

TECHNICAL FIELD

The present invention generally relates to improved calibration of measuring instruments. In particular, the present invention relates to reducing electrostatic charges on standard developed photoresist patterns using a conductive photoresist which improves calibration of measuring instruments, such as scanning electron microscopes.

BACKGROUND ART

Microlithography processes for making miniaturized electronic components, such as in the fabrication of computer chips and integrated circuits, involve using photoresists. Generally, a coating or film of a photoresist is applied to a substrate material, such as a silicon wafer used for making integrated circuits. The substrate may contain any number of layers or devices thereon.

The photoresist coated substrate is baked to evaporate any solvent in the photoresist composition and to fix the photoresist coating onto the substrate. The baked coated surface of the substrate is next subjected to selective radiation; that is, an image-wise exposure to radiation. This radiation exposure causes a chemical transformation in the exposed areas of the photoresist coated surface. After selective exposure, the photoresist coated substrate is treated with a developer solution to dissolve and remove either the radiation-exposed or the unexposed areas of the photoresist (depending upon whether a positive photoresist or a negative photoresist is utilized) resulting in a patterned or developed photoresist. Many developer solutions contain water and a base, such as water and a hydroxide compound.

Treating a selectively exposed photoresist with a developer conventionally involves depositing the liquid developer solution over the photoresist clad substrate and spinning the substrate whereby the liquid developer solution and dissolved areas of the photoresist are removed from the substrate by centrifugal forces. A rinsing solution, typically water, is then deposited over the photoresist clad substrate and the substrate is spun again to remove the water and any debris solubilized by the water. Spinning the substrate is a convenient and inexpensive method of removing materials from substrate. However, electrostatic charges build up on the developed photoresist during the development and water rinse cycles. Negative charges are particularly encountered on developed photoresists. While the causes of this phenomenon are not completely understood, it is believed that electrostatic charges and/or resist developer and/or deionized water rinse contribute to charge accumulation. Charge accumulation on developed photoresists can be as high as 300–400 volts, and it is typically negative.

Electrostatic charges also build up on the developed photoresist that may be used as a standard for calibrating a scanning electron microscope (SEM) or an atomic force microscope (AFM). A standard developed photoresist has at least one feature having a known size or dimension, such as a line having a linewidth of 0.20 $\mu$m (additional features also of known sizes, the same or different, may also be present). Repeated use of the same standard developed photoresist for calibrating a SEM or AFM tends to induce an undesirable charge build up. In as little as 3 days of daily calibration, electrostatic charges build up on the standard developed photoresist to an extent where a feature on the standard developed photoresist appears larger than it actually is. This in turn subsequently leads to inaccurate linewidth measurements due to miscalibration of a SEM or AFM.

Negative charge accumulation on a developed photoresist presents a number of problems. One notable problem is that measurement of various resist features, such as linewidth and profiling, is rendered inaccurate. Especially when using a SEM or an AFM, it is difficult to obtain accurate data. This is because SEMs and AFMs use an electron beam for generating images (both in projection and detection). The electron beam from the SEM or AFM may be repulsed by the negative charge accumulated on the photoresist. The degree of repulsion or deviation from an ideal direction is dependent upon the magnitude of the accumulated negative charge.

Another aspect of this problem is that secondary electrons emitted from the surface of the features under measurement (such as the patterned photoresist) are reduced due to negative charge accumulation. As a result, the secondary electron signal received at the detector does not represent the correct signal (as in instances where electrostatic charges do not exist on the patterned photoresist). Hence, in the case of a linewidth measurement having a developed photoresist with negative charge accumulation thereon, the SEM does not accurately measure the width because the secondary electron signal is reduced.

Figure 1:
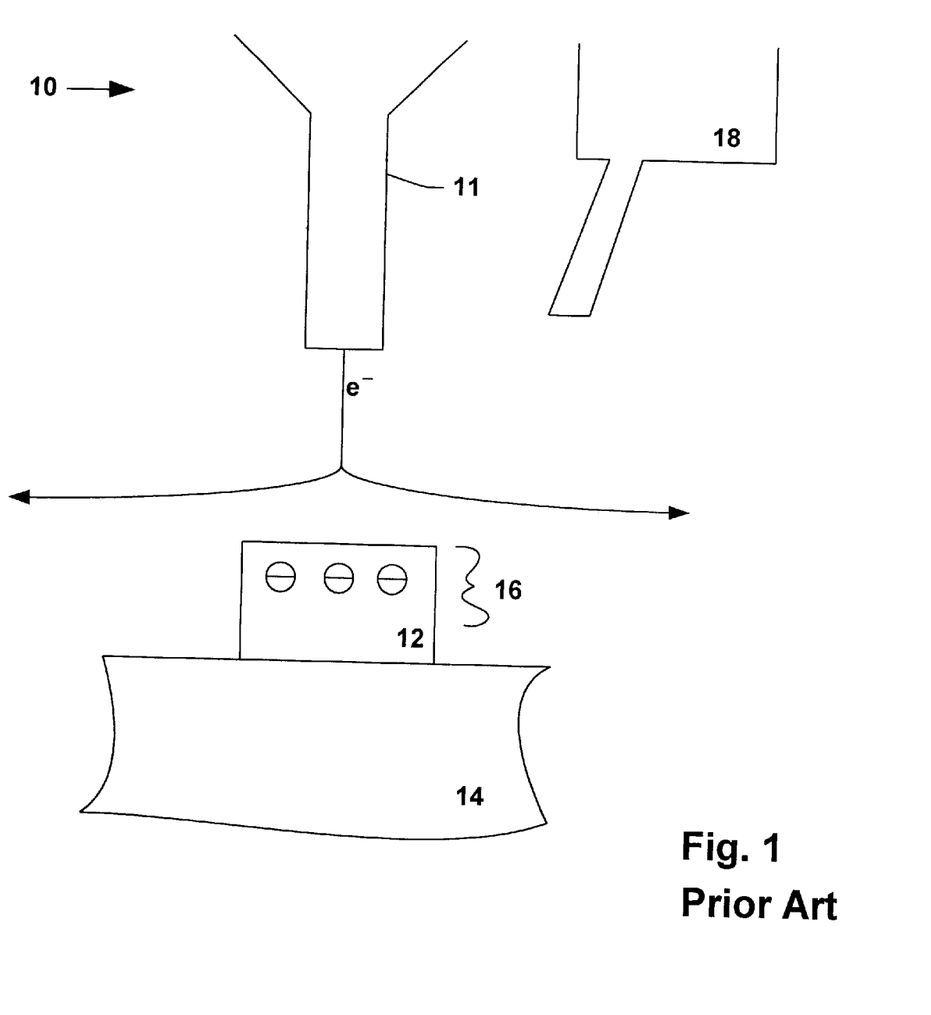
FIG. 1 is a view of a prior art developed photoresist detection scheme using an SEM.
Figure 2:
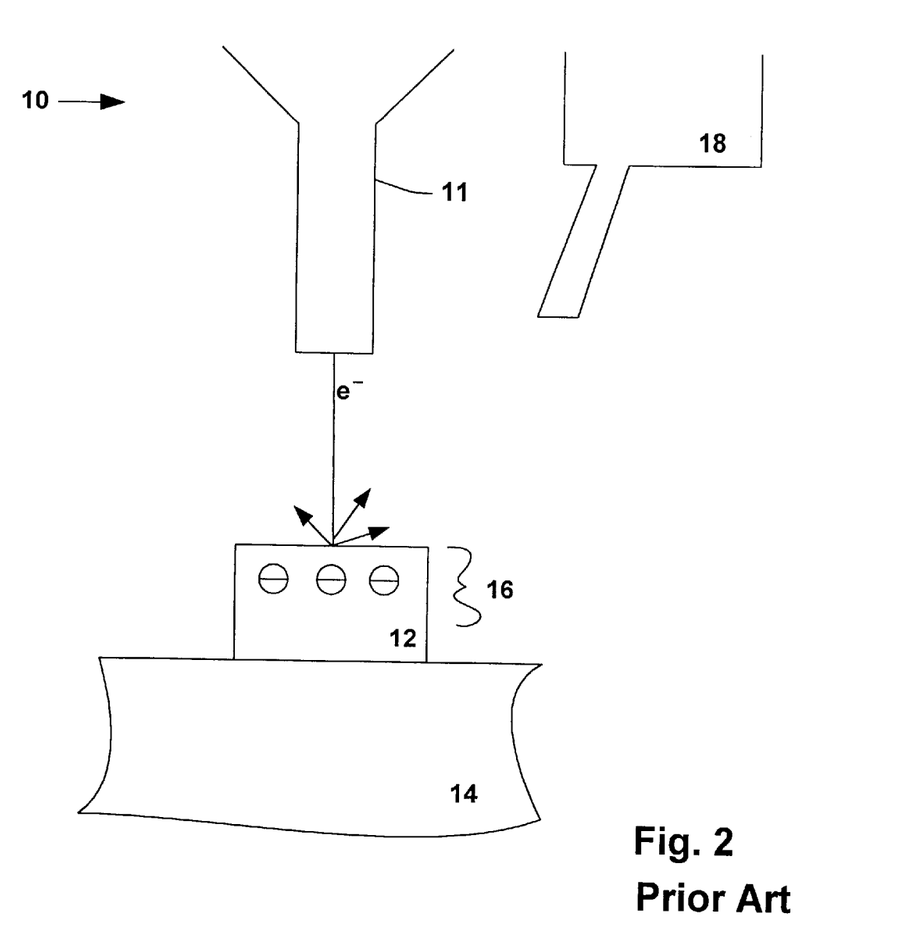
FIG. 2 is a view of a prior art developed photoresist detection scheme using an SEM.

This phenomenon is shown in FIGS. 1 and 2. Referring to FIG. 1, SEM 10 emits an electron beam (represented by the arrow(s)) from tip 11 towards a developed photoresist structure 12 on semiconductor substrate 14. The developed photoresist structure 12 has an accumulation of negative charge 16 as a result of the lithography process and/or repeated use as a standard. Due to repulsion between the electron beam and the negative charge 16 of the developed photoresist structure 12, the electron beam path is altered away from the developed photoresist structure 12 without having reflected off or contacting the developed photoresist structure 12. Since the electron beam is not incident on the developed photoresist structure 12, an accurate measure/profile of the structure cannot be obtained. Detection of the altered electron beams by detector 18 of SEM 10 provides data indicating at least one of inaccurate linewidth, fuzzy corner definition, and otherwise non-focused images. Assessment of the quality and parameters of a lithography process is consequently difficult or inaccurate and often impossible.

Referring to FIG. 2, SEM 10 emits an electron beam (represented by the arrow(s)) from tip 11 towards a developed photoresist structure 12 on semiconductor substrate 14. The developed photoresist structure 12 has an accumulation of negative charge 16 as a result of the lithography process and/or repeated use as a standard. Due to the negative charge 16 of the developed photoresist structure 12, the secondary electron signal is reduced; that is, the accumulation of negative charges 16 interferes with the ability of the electron beam to neatly reflect off of and be received by detector 18 of SEM 10.

This is especially true with regard to measuring linewidth and with using photoresists sensitive to small wavelengths of light. Photoresists sensitive to relatively small wavelengths of light are typically formed or developed into finer patterns (e.g., smaller linewidths) compared to photoresists sensitive to relatively large wavelengths of light. Linewidth measurements taken on undesirably charged photoresists often yield parameters in error, sometimes by an order of magnitude. For example, an SEM scanning an undesirably charged photoresist having a linewidth of 0.20 $\mu$m may incorrectly indicate that the linewidth is 0.24 µm. This is primarily due to charge induced deviation of the electron beam used to measure the linewidth. Such errors cannot be tolerated because they lead to fatal construction errors in subsequent processing.

Figure 3:
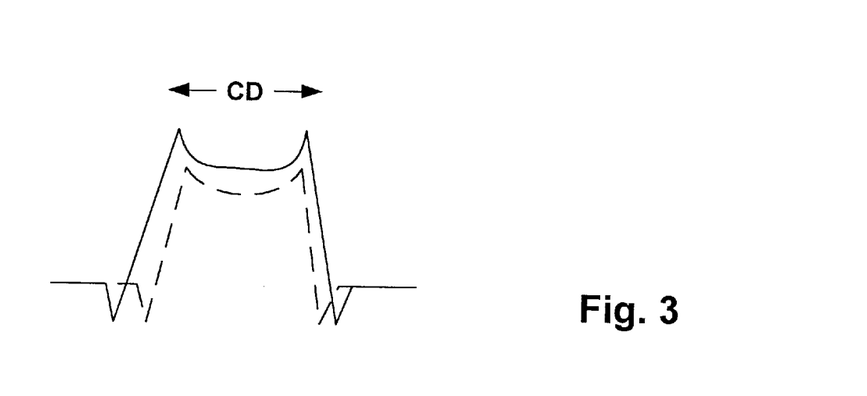
FIG. 3 is a critical dimension data graph of a secondary electron profile of the prior art developed photoresist of FIG. 1 using an SEM.

Referring to FIG. 3, the critical dimension data graph of a secondary electron profile of the developed photoresist of FIG. 1 using an SEM is shown by the solid line. An accurate measurement of the developed photoresist of FIG. 1 should yield the dashed line of FIG. 3, but due to undesirable charge accumulation, the apparent critical dimension is inaccurately wide. Accurate critical dimension measurements are desired.

SUMMARY OF THE INVENTION

The present invention provides an improved method for evaluating a lithography process by using a patterned conductive photoresist to calibrate a measurement instrument. The present invention also provides methods for minimizing charge accumulation and/or dissipating charge accumulation on a patterned photoresist, especially patterned photoresists having relatively small linewidths, that are used to calibrate measuring instruments. As a result of the present invention, evaluation of a patterned photoresist, such as linewidth measurement, profile data, corner sharpness, critical dimension determinations, and image inspection, is substantially improved, since calibration of the evaluating instrument is improved. Subsequent processing of semiconductor substrates after photolithography is accordingly improved.

One aspect of the present invention relates to a method of calibrating a measurement instrument that uses an electron beam, involving the steps of providing a conductive photoresist on a semiconductor structure having a conductivity of at least about 0.1 S/cm; exposing and developing the conductive photoresist to provide a patterned conductive photoresist; using the semiconductor structure having the patterned conductive photoresist thereon as a standard for calibration; and calibrating the measurement instrument.

Another aspect of the present invention relates to a method of reducing electrostatic charges on a standard developed photoresist to improve repeated calibrations of a measurement instrument that uses an electron beam, involving the steps of providing a conductive photoresist on a semiconductor structure; exposing the conductive photoresist with radiation having a wavelength of about 370 nm or less; developing the conductive photoresist to provide a patterned conductive photoresist, wherein the patterned conductive photoresist has a conductivity of at least about 0.01 S/cm; and calibrating the measurement instrument with the semiconductor structure having the patterned conductive photoresist thereon as a standard.

Yet another aspect of the present invention relates to a method of improving critical dimension measurement of an integrated circuit feature, involving the steps of providing a conductive photoresist on a semiconductor structure having a conductivity of at least about 0.1 S/cm; exposing the conductive photoresist; developing the conductive photoresist to provide a patterned conductive photoresist having a conductivity of at least about 0.01 S/cm; calibrating a scanning electron microscope with the semiconductor structure having the patterned conductive photoresist thereon as a standard; and measuring critical dimensions of the integrated circuit feature with an electron beam generated from the scanning electron microscope.

DISCLOSURE OF INVENTION

The present invention involves improving the development and evaluation of a photoresist by reducing undesirable charge accumulation and/or dissipating charge accumulation on a patterned photoresist, especially patterned photoresists used as standards for calibrating a measurement/evaluation instrument using an electron beam, such as SEMs or AFMs. The present invention more specifically involves employing a conductive photoresist which effectively reduces dissipates the accumulation of negative charges on the patterned photoresist during lithographic processing and/or repeated calibrations. Reducing/dissipating negative electric charges on the patterned photoresist enables the accurate evaluation of patterned photoresists and other semiconductor structures using an electron beam, such as that generated by a SEM or an AFM. In particular, an electron beam directed at a patterned photoresist used as a standard is not deflected or repelled by negative charges; instead, it reflects off of the standard patterned photoresist where it is accurately detected by a detector, thereby enabling uniform and accurate calibration of a SEM or an AFM.

In accordance with the present invention, a conductive photoresist is provided over a semiconductor substrate. The semiconductor substrate is typically a silicon substrate optionally with various elements and/or layers thereover; including metal layers, barrier layers, dielectric layers, device structures, active elements and passive elements including polysilicon gates, wordlines, source regions, drain regions, bit lines, bases, emitters, collectors, conductive lines, conductive plugs, etc. The conductive photoresist is provided over at least a portion of the substrate, but typically over the entire substrate.

The conductive photoresist may be applied to the substrate surface by any suitable means. The conductive photoresist is typically sensitive to relatively short wavelengths of light, although any wavelength can be employed. For purposes of this invention, short wavelengths of light include those of about 370 nm or less. In another embodiment, short wavelengths of light include those of about 250 nm or less. For example, a 365 nm sensitive photoresist, a 248 nm sensitive photoresist, a 157 nm sensitive photoresist, a 193 nm sensitive photoresist, deep UV, extreme UV, X-ray resist, electron beam resist or chemically amplified photoresist material may be spin-coated on the substrate surface. Spin-coating involves depositing the conductive photoresist in a solution over a spinning substrate. The centrifugal forces of the spinning substrate serve to evenly distribute the conductive photoresist over the substrate.

The conductive photoresists contain conductive polymer materials. Selection of any particular conductive photoresist is not critical to the invention. Examples of conductive polymer materials include substituted and unsubstituted homopolymers and copolymers of aniline, thiophene, pyrrole, p-phenylene sulfide, azines, selenophenes, furans, thianaphthenes, phenylene vinylene, phenylene, acetylene, etc. Conductive polymers include substituted and unsubstituted polyparaphenylenes, polyparaphenylevevinylenes, polyanilines, polyazines, polythiophenes, poly-p-phenylene sulfides, polyfuranes, polypylroles, polythianaphthenes, polyselenophenes, polyacetylenes, polydiacetylenes, polybithiophenes, polyisothianaphthene, polythienylvinylenes, and combinations thereof and copolymers of monomers thereof, treated if necessary so as to possess conductive properties. For example, a specific conductive polymer is 3-hexylthiophene-3-thioplhene-ethane-methacrylate copolymer.

The polymeric material may be conductive itself, it may be rendered conductive by one of oxidation, reduction, and protonation, or an electron acceptor or conductive salt may be combined with the polymeric material to form the conductive polymer material.

The polymer may have acid sensitive side chain (pendant) groups which are bonded to the polymer backbone and are reactive towards a proton. The conductive photoresist may further contain a photoacid generator. Upon imagewise exposure to radiation, the photoacid generator produces a proton. The proton causes catalytic cleavage of the pendant group from the polymer backbone. The cleaved polymer is soluble in polar developers while the unexposed polymer is soluble in nonpolar organic solvents.

The photoacid generator may be chosen from a wide variety of compounds known to form acid upon exposure to activating radiation. These photoacid generators form an acid in response to radiation of different wavelengths ranging from deep ultra violet (DUV) to X-ray and even e-beams. In one general embodiment, photoacid generating compounds include aromatic substituted halohydrocarbons (such as 1,1-bis(p-chlorophenyl)-2,2,2-trichloroethane), halo-substituted sulfur containing compounds, haloheterocyclic compounds, onium salts (such as diaryl diazonium salts), sulfonated esters, and sulfonated ketones.

In one embodiment, the conductive photoresist has a conductivity of at least about 0.1 S/cm prior to exposure and at least about 0.01 S/cm after exposure. In another embodiment, the conductive photoresist has a conductivity of at least about 1 S/cm prior to exposure and at least about 0.1 S/cm after exposure. In yet another embodiment, the conductive photoresist has a conductivity of at least about 5 S/cm prior to exposure and at least about 0.5 S/cm after exposure.

Positive or negative conductive photoresists may be used, but positive conductive photoresists are preferred. Photoresists are commercially available from a number of sources, including Shipley Company, DuPont, Arch Chemical, Aquamer, Hunt, Hoechst Celanese Corporation, Clariant, JSR Microelectronics, and Brewer. The conductive photoresist is typically applied to a thickness from about 200 Å to about 20,000 Å. Since relatively small linewidths are often achieved using thin photoresists, the thickness of the conductive photoresist may be relatively small. Accordingly, in another embodiment, the thickness of the conductive photoresist is from about 250 Å to about 5,000 Å. In yet another embodiment, the thickness of the conductive photoresist is from about 300 Å to about 2,000 Å.

Optionally after the conductive photoresist is applied to the substrate surface, the photoresist covered substrate is subjected to a soft bake to drive off excess solvent and/or to increase adhesion with the substrate surface. The soft bake involves heating at an elevated temperature for a suitable period of time.

The conductive photoresist covered substrate is selectively exposed to actinic radiation to cause a chemical transformation in desired regions of the photoresist. A mask is typically employed to selectively expose the conductive photoresist.

The selectively exposed photoresist is developed using a suitable developer, such as an aqueous developer. The specific identity of the developer is not critical to the invention, but typically an aqueous alkaline solution is employed. For example, aqueous tetramethylammonium hydroxide is employed as a developer solution. The developer solution is deposited over a spinning photoresist clad substrate. The spinning action serves to uniformly spread the developer over and then off of the photoresist clad substrate.

During development, either the exposed portion of the conductive photoresist (in embodiments where a positive conductive photoresist is employed) or the unexposed portion of the conductive photoresist (in embodiments where a negative conductive photoresist is employed) is soluble or is solubilized in the developing solution. The portion of the photoresist that is not substantially soluble in the developing solution remains on the substrate. Development results in a patterned conductive photoresist (the remaining portion of the conductive photoresist) over the substrate surface.

The size of some of the structural features of the patterned conductive photoresist, such as linewidth, are about 20,000 Å or less (other features may be larger). In another embodiment, the size of some of the structural features of the patterned conductive photoresist are about 10,000 Å or less. In yet another embodiment, the size of some of the structural features of the patterned conductive photoresist are about 5,000 Å or less. In still yet another embodiment, the size of some of the structural features of the patterned conductive photoresist are about 2,500 Å or less.

The structural features of the patterned conductive photoresist may take the form of any shape, such as a line. Once a given patterned conductive photoresist feature is sized (that is, its size is accurately determined), it may be used repeatedly as a standard for calibrating a SEM or an AFM. Typically, it is necessary to calibrate a SEM or AFM every time the power is restored after an "off" period. Methods of calibrating a SEM or AFM are known by those skilled in the art. Once a SEM or AFM is properly calibrated, accurate measurements can be taken/determined. Repeatedly as the same standard for calibrating a SEM or an AFM leads to charge accumulation on the standard patterned conductive photoresist. Moreover, due to the lithography processing, and especially the developer and water rinse spin cycles, electrostatic charges tend accumulate on the standard patterned conductive photoresist.

Employing the conductive photoresist, however, accumulated negative charges are reduced, dissipated, minimized and/or eliminated. As a result, subsequent processing of a semiconductor substrate is facilitated. Especially when calibrating an SEM or AFM the developed conductive photoresist, accumulated negative charges are reduced, dissipated, minimized and/or eliminated. Even after about 7 days of daily calibration, electrostatic charges do not accumulate on the developed conductive photoresist. In another embodiment, after about 10 days of daily calibration, electrostatic charges do not accumulate on the developed conductive photoresist. In yet another embodiment, after about 15 days of daily calibration, electrostatic charges do not accumulate on the developed conductive photoresist.

Figure 4:
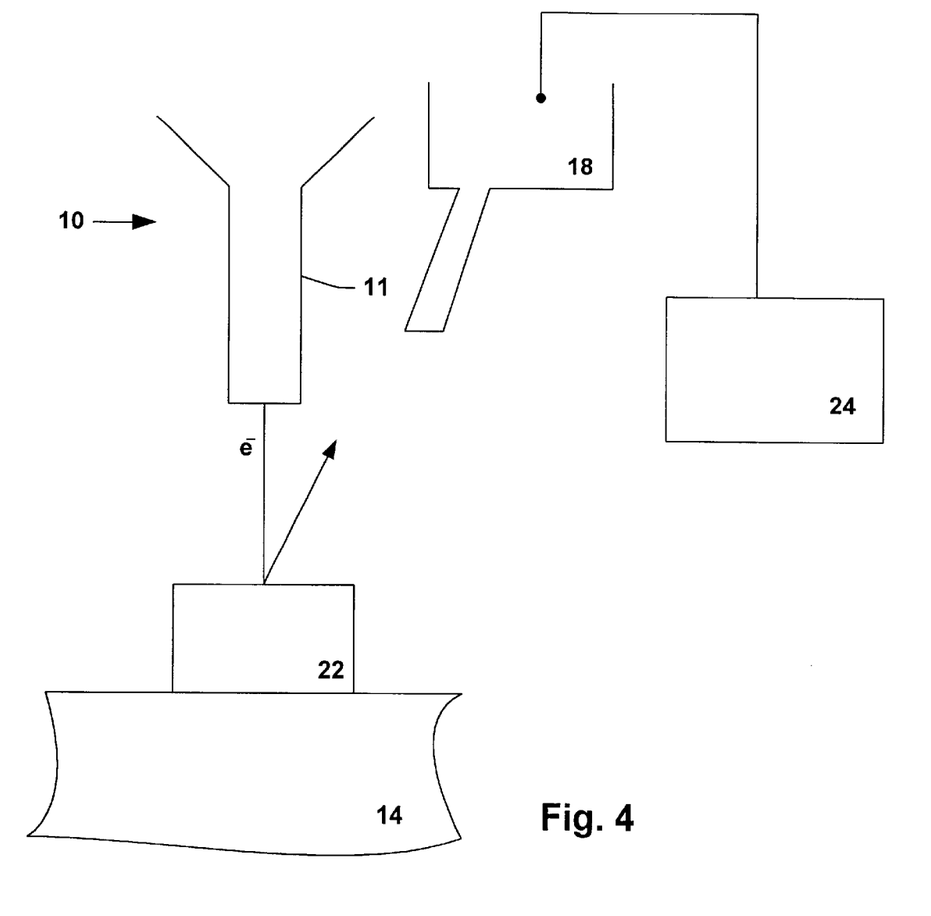
FIG. 4 is a view of a developed photoresist detection scheme using an SEM in accordance with one aspect of the present invention.

Referring to FIG. 4, subsequent processing involving calibration, inspection, and/or measurement is shown, wherein like elements are represented with like numerals in relation to FIG. 1. In FIG. 4, SEM 10 containing tip 11 and detector 18 emits an electron beam (represented by the arrow) from the tip 11 towards a standard developed conductive photoresist structure 22 on semiconductor substrate 14. The developed conductive photoresist structure 22 is known to have a width of about 2,000 Å and it is used to calibrate the SEM 10. The electron beam reflects off of the standard developed conductive photoresist structure 22 and is detected by a detector 18 of the SEM. Since the negative charges that may have accumulated on the standard developed conductive photoresist 22 surface are eliminated by the present invention, the electron beam from SEM 10 is not repelled or deflected but instead detected after reflecting off of the standard developed conductive photoresist 22. Consequently, an accurate measurement of linewidth, lincheight, sharp corner definition, focussed structural details and/or accurate profile data (or other evaluation data) of various features subsequently using the SEM 10 may be obtained. Assessment of the quality and parameters of a lithography process is consequently improved by the present invention. In another aspect of the present invention, the SEM is optionally connected to a microprocessor controller 24, which can be a super computer. The microprocessor controller 24 assembles data received from the detector and generates a profile or data graph.

Figure 5:
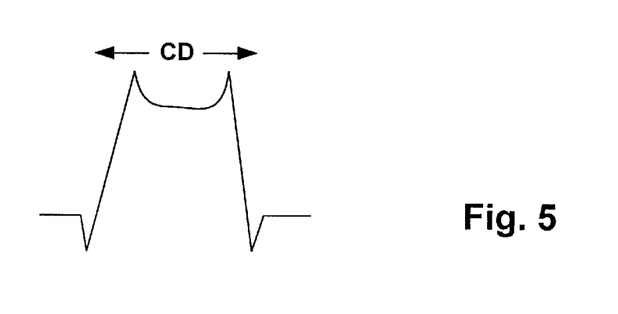
FIG. 5 is a critical dimension data graph of a secondary electron profile of the developed photoresist of FIG. 3 using an SEM in accordance with one aspect of the present invention.

ReferTing to FIG. 5, the critical dimension data graph of the standard developed photoresist of FIG. 4 using the SEM 10 and microprocessor controller 24 is shown by the solid line. The critical dimension measurement of the standard developed photoresist of FIG. 4 is accurate (it correctly corresponds to the size of the standard developed conductive photoresist structure 22) since charge accumulation on the standard developed photoresist is minimized and/or eliminated because a conductive photoresist is employed.

Comparing a standard developed conductive photoresist with a standard non-conductive photoresist after 7 days of daily calibration of a SEM, the standard developed conductive photoresist has at least about 50% less negative charge (for example, in volts) than a standard developed non-conductive photoresist under comparable circumstances (comparable circumstances meaning on a similar substrate, developed in a similar manner, having similar linewidths, and the like). In another embodiment, the standard developed conductive photoresist has at least about 75% less negative charge than the standard non-conductive developed photoresist under comparable circumstances. In yet another embodiment, the standard developed conductive photoresist has at least about 90% less negative charge than the standard non-conductive developed photoresist under comparable circumstances. In still yet another embodiment, the standard developed conductive photoresist has no detectable negative charge (is electrically neutral).

Figure 6:
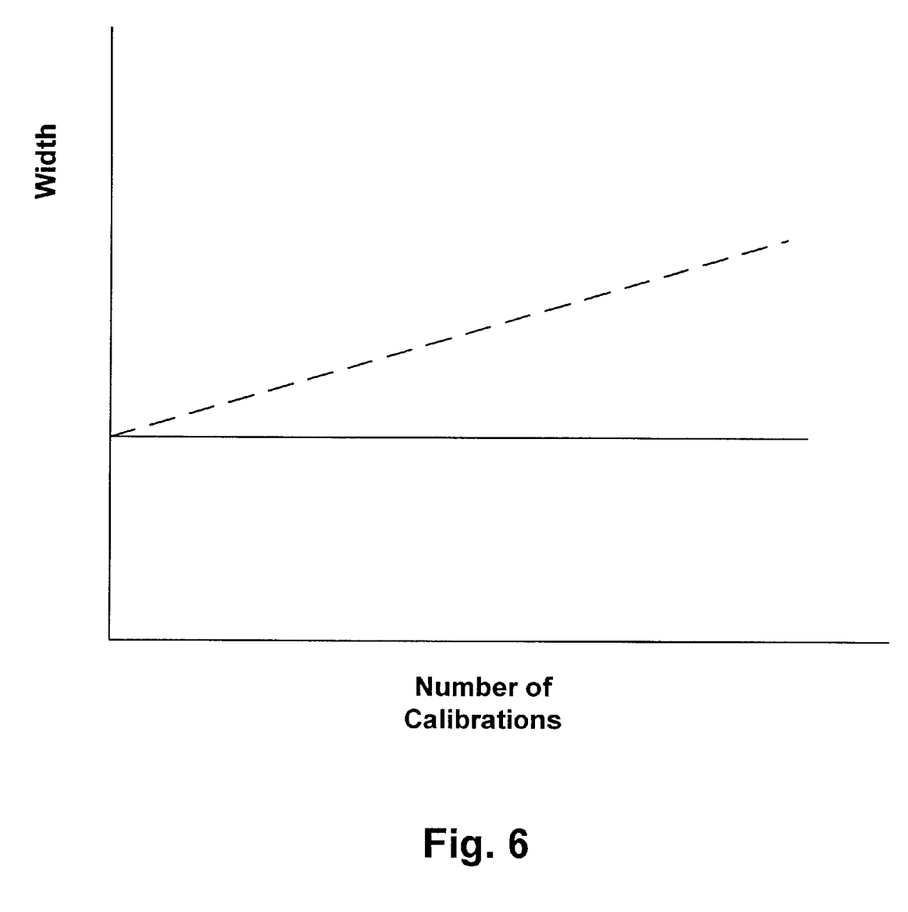
FIG. 6 is a graph comparing the measured width of a line as it is used to calibrate an SEM over time.

This phenomenon is graphically illustrated in FIG. 6. The lines plotted on the graph represent the width of a standard photoresist as measured when calibrating a SEM over time (repeated calibrations with the same standard photoresist). FIG. 6 shows that a standard developed conductive photoresist (used in accordance with the present invention) represented by the plotted solid line provides uniform and consistent measurements even as the number of calibrations increases for a SEM over time. To the contrary, FIG. 6 shows that a standard developed non-conductive photoresist represented by the plotted dashed line shows the undesirable effects of accumulated electrostatic charges on a standard photoresist. The dashed indicates that the perceived width of the standard gets larger as the number of calibrations (number of re-calibrations) increases.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of calibrating a measurement instrument that uses an electron beam, comprising:
   providing a conductive photoresist on a semiconductor structure having a conductivity of at least about 0.1 S/cm;
   exposing and developing the conductive photoresist to provide a patterned conductive photoresist;
   using the semiconductor structure having the patterned conductive photoresist thereon as a standard for calibration; and
   calibrating the measurement instrument.

2. The method of claim 1, wherein the conductive photresist comprises at least one of substituted and unsubstituted polyparaphenylenes, polyparaphenylevevinylenes, polyanilines, polyazines, polythiophenes, poly-p-phenylene sulfides, polyfuranes, polypyrroles, polythianaphthenes, polyselenophenes, polyacetylenes, polydiacetylenes, polybithiophenes, polyisothianaphthene, polythienylvinylenes, and combinations thereof and copolymers of monomers thereof.

3. The method of claim 1, further comprising recalibrating the measurement instrument at least about 7 times using the semiconductor structure having the patterned conductive photoresist thereon as a standard for calibration.

4. The method of claim 1, wherein the conductive photresist is exposed with radiation having a wavelength of about 370 nm or less.

5. The method of claim 1, wherein the conductive photresist provided on the semiconductor structure has a conductivity of at least about 5 S/cm.

6. The method of claim 1, wherein the patterned conductive photoresist has a conductivity of at least about 0.5 S/cm.

7. The method of claim 1, wherein calibrating the measurement instrument involves at least one of taking a linewidth measurement, generating profile data, determining corner sharpness, determining critical dimension control, and making an image of the patterned conductive photoresist on the semiconductor structure.

8. The method of claim 1, wherein the measurement instrument is a scanning electron microscope or an atomic force microscope.

9. A method of reducing electrostatic charges on a standard developed photoresist to improve repeated calibrations of a measurement instrument that uses an electron beam, comprising:

provi ding a conductive photoresist on a semiconductor structure;

exposing the conductive photoresist with radiation having a wavelength of about 370 nm or less;

developing the conductive photoresist to provide a patterned conductive photoresist, wherein the patterned conductive photoresist has a conductivity of at least about 0.01 S/cm; and calibrating the measurement instrument with the semiconductor structure having the patterned conductive photoresist thereon as a standard.

10. The method of claim 9, wherein the conductive photresist comprises at least one of substituted and unsubstituted polyparaphenylenes, polyparaphenylevevinylenes, polyanilines, polyazines, polythiophenes, poly-p-phenylene sulfides, polyfuranes, polypyrroles, polythianaphthenes, polyselenophenes, polyacetylenes, polydiacetylenes, polybithiophenes, polyisothianaphthene, polythienylvinylenes, and combinations thereof and copolymers of monomers thereof.

11. The method of claim 9, wherein the conductive photresist comprises at least one photoacid generating compound selected from aromatic substituted halohydrocarbons, halo-substituted sulfur containing compounds, haloheterocyclic compounds, onium salts, sulfonated esters, and sulfonated ketones.

12. The method of claim 9, wherein repeated calibrations involve calibrating the measurement instrument at least about 10 times using the patterned conductive photoresist as the standard.

13. The method of claim 9, wherein the conductive photresist provided on the semiconductor structure has a conductivity of at least about 0.1 S/cm.

14. The method of claim 9, wherein the patterned conductive photoresist has no detectable negative charge.

15. The method of claim 9, wherein the measurement instrument is a scanning electron microscope or an atomic force microscope.

16. A method of improving critical dimension measurement of an integrated circuit feature, comprising:

providing a conductive photoresist on a semiconductor structure having a conductivity of at least about 0.1 S/cm;

exposing the conductive photoresist;

developing the conductive photoresist to provide a patterned conductive photoresist having a conductivity of at least about 0.01 S/cm;

calibrating a scanning electron microscope with the semiconductor structure having the patterned conductive photoresist thereon as a standard; and measuring critical dimensions of the integrated circuit feature with an electron beam generated from the scanning electron microscope.

17. The method of claim 16, wherein the conductive photoresist comprises at least one of substituted and unsubstituted polyparaphenylenes, polyparaphenylevevinylenes, polyanilines, polyazines, polythiophenes, poly-p-phenylene sulfides, polyfuranes, polypyrroles, polythianaphthenes, polyselenophenes, polyacetylenes, polydiacetylenes, polybithiophenes, polyisothianaphthene, polythienylvinylenes, and combinations thereof and copolymers of monomers thereof.

18. The method of claim 16, wherein the patterned conductive photoresist has no detectable negative charge.

19. The method of claim 16, wherein the conductive photresist provided on the semiconductor structure has a conductivity of at least about 1 S/cm.

20. The method of claim 16, wherein the patterned conductive photoresist has a conductivity of at least about 0.1 S/cm.

* * * * *

UNITED STATES PATENT AND TRADEMARK OFFICE
CERTIFICATE OF CORRECTION

PATENT NO. : 6,319,643 B1
DATED : November 20, 2001
INVENTOR(S) : Bhanwar Singh et al.

It is certified that error appears in the above-identified patent and that said Letters Patent is hereby corrected as shown below:

Column 8,
Lines 38, 39, 51, 52, 54 and 55, "photresist" changed to -- photoresist --.

Column 9,
Lines 5, 7, 18 and 27, the word "photresist" changed to -- photoresist --.

Column 10,
Lines 22 and 33, the word "photresist" changed to -- photoresist --.

Signed and Sealed this

Twenty-first Day of May, 2002

Attest:

Attesting Officer

JAMES E. ROGAN
Director of the United States Patent and Trademark Office